United States Patent [19]

Becker et al.

[11] 4,322,766

[45] Mar. 30, 1982

[54] MONITORING DEVICE FOR THE CAPACITOR BATTERY OF A D-C FILTER CIRCUIT

[75] Inventors: Michael Becker, Uttenreuth; Klaus Renz, Fürth; Manfred Weibelzahl, Weiher, all of Fed. Rep. of Germany

[73] Assignee: Siemens Aktiengesellschaft, Munich, Fed. Rep. of Germany

[21] Appl. No.: 165,754

[22] Filed: Jul. 3, 1980

[30] Foreign Application Priority Data

Jul. 24, 1979 [DE] Fed. Rep. of Germany ....... 2930034

[51] Int. Cl.³ .............................................. H02H 7/16
[52] U.S. Cl. ...................................... 361/17; 361/15; 361/87; 361/113; 340/635
[58] Field of Search ....................... 361/15, 16, 17, 87, 361/86, 113, 78; 324/51, 60 R, 60 C; 340/635

[56] References Cited

U.S. PATENT DOCUMENTS

| | | | |
|---|---|---|---|
| 3,755,711 | 8/1973 | Fendt | 361/17 |
| 3,984,734 | 10/1976 | Becker | 361/17 |
| 4,104,687 | 8/1978 | Zulaski | 361/17 |

FOREIGN PATENT DOCUMENTS 609164 5/1978 U.S.S.R. ................................ 361/17

*Primary Examiner*—Patrick R. Salce

[57] ABSTRACT

A circuit for monitoring the capacitor battery of a filter circuit connected to a transmission line, the capacitor battery consisting of at least two parallel legs, each with a number of series-connected capacitors. A first signal is produced which corresponds to the total alternating current flowing through the capacitor battery. A second signal is produced which corresponds to the difference between the currents flowing through the respective parallel legs of the capacitor battery. The current difference signal is compared with a respective fraction of the total current signal. A fault indicator signal is produced if the difference between the difference current signal and the fractional total current signal exceeds a predetermined threshold value. Further circuitry is provided for correcting drift in the difference current signal, which may be caused by temperature variations or acceptable capacitor failures. Automatic ranging circuitry may be provided in embodiments of the invention in which the total capacitor battery current varies in amplitude over a large range.

4 Claims, 5 Drawing Figures

MONITORING DEVICE FOR THE CAPACITOR BATTERY OF A D-C FILTER CIRCUIT

BACKGROUND OF THE INVENTION

This invention relates generally to circuits for monitoring the capacitor battery of a direct current transmission line filter circuit, and more particularly to circuits for determining whether one or more capacitors in a capacitor battery having at least two parallel legs, each with a plurality of capacitors connected in series, have failed.

It is highly desirable in the operation of transmission lines which carry direct current produced by the rectification of alternating currents, to remove the harmonic frequency signal components which are superimposed on the direct current signal. Such harmonics are generally removed from the transmission line by filter circuits consisting of capacitive, inductive and resistive components. In direct current transmission systems which handle high voltages, the capacitive filter component usually consists of a plurality of individual capacitors which are arranged in a capacitor battery having at least two parallel legs, each with a number of capacitors connected in series. In such an arrangement, the failure of one capacitor in the capacitor battery will detune the circuit, but will not affect the total current flowing through the capacitor battery sufficiently to be detectable by measurement of the total current flowing through the capacitor bank. Since the harmonic currents flowing through the capacitor bank range in amplitude by a factor of approximately 100, depending upon the control angle of the rectifier, it would be extremely difficult to measure the widely varying current and determine whether a capacitor has failed.

It is a further problem in filter circuits which contain a large number of capacitors in a capacitor bank that variations in current resulting from the effect of temperature are larger than the current changes caused by the failure of one, or several, capacitors. Thus, even if the electrical characteristics of a transmission line and the control angle of the rectifier were known, the failure of a capacitor in the capacitor bank is not determinable only by measurement of the total current flowing through the capacitor bank.

Accordingly, it is an object of this invention to provide a circuit for monitoring a capacitor bank and reliably determining whether one or more capacitors have failed.

It is a further object of this invention to provide a circuit for determining whether one or more capacitors in a capacitor bank have failed by a measurement of the currents flowing through the capacitor bank.

SUMMARY OF THE INVENTION

The foregoing and other problems which exist in the prior art are alleviated by this invention which provides a circuit for monitoring a capacitor bank in a transmission line filter circuit, and determining whether one or more capacitors in the capacitor bank have failed by measurement of the current flowing through the capacitor bank. The capacitor bank consists of a plurality of capacitors which are grouped in identical parallel-connected legs, each having a plurality of series capacitors. Signals are produced corresponding to the harmonic currents flowing through each leg, which signals are subtractively and additively combined so as to produce signals corresponding to the difference between the harmonic current flowing in the respective legs, and the total harmonic current flowing through the capacitor battery, respectively. The signal corresponding to the difference between the currents flowing through the legs is compared to a predetermined fraction of the signal corresponding to the total capacitor bank current. A signal is produced correspondng to the difference, and is conducted to respective limit indicators which are each connected to a respective time delay circuit. The output signals of plural limit indicators and the output signals of the corresponding time delay circuits are each summed in respective summing stages, which respective summed output signals are compared, the difference therebetween being conducted to an evaluation circuit.

The basis of this invention lies in the fact that although the failure of a capacitor in the capacitor battery will not measurably affect the total current flowing through the capacitor battery, the current distribution over the individual legs will be measurably affected. For this reason, the difference in the currents flowing through the legs, or groups of legs, is determined. In order to prevent erroneous capacitor failure signals resulting from variations in the total capacitor bank current from being produced, the difference signal is evaluated with respect to the total current signal. Thus, capacitor failure indicator signals are produced only if the difference in the current flowing through the respective legs changes without a simultaneous change to the same extent and in the same sense as the total current. Moreover, erroneous capacitor failure signals resulting from the effect of temperature are prevented by the advantageous use of limit indicators in combination with time delay circuits. This is achieved, as noted hereinabove, by combining the output signals of the limit indicators to produce a combined limit indicator output signal, and combining the output signals of the time delay circuits to produce a combined time delay output signal. The respective combined signals are compared, and the difference between them is evaluated. A failure indication is produced in response to the difference between the respective combined signals. Upon the expiration of the delay response interval of the delay circuit, the failure indication is preserved and the monitoring circuit is prepared to indicate the presence of subsequent failures, if any.

BRIEF DESCRIPTION OF THE DRAWINGS

Comprehension of the invention is facilitated by reading the following detailed description in conjunction with the drawings in which.

DETAILED DESCRIPTION

Figure 1:
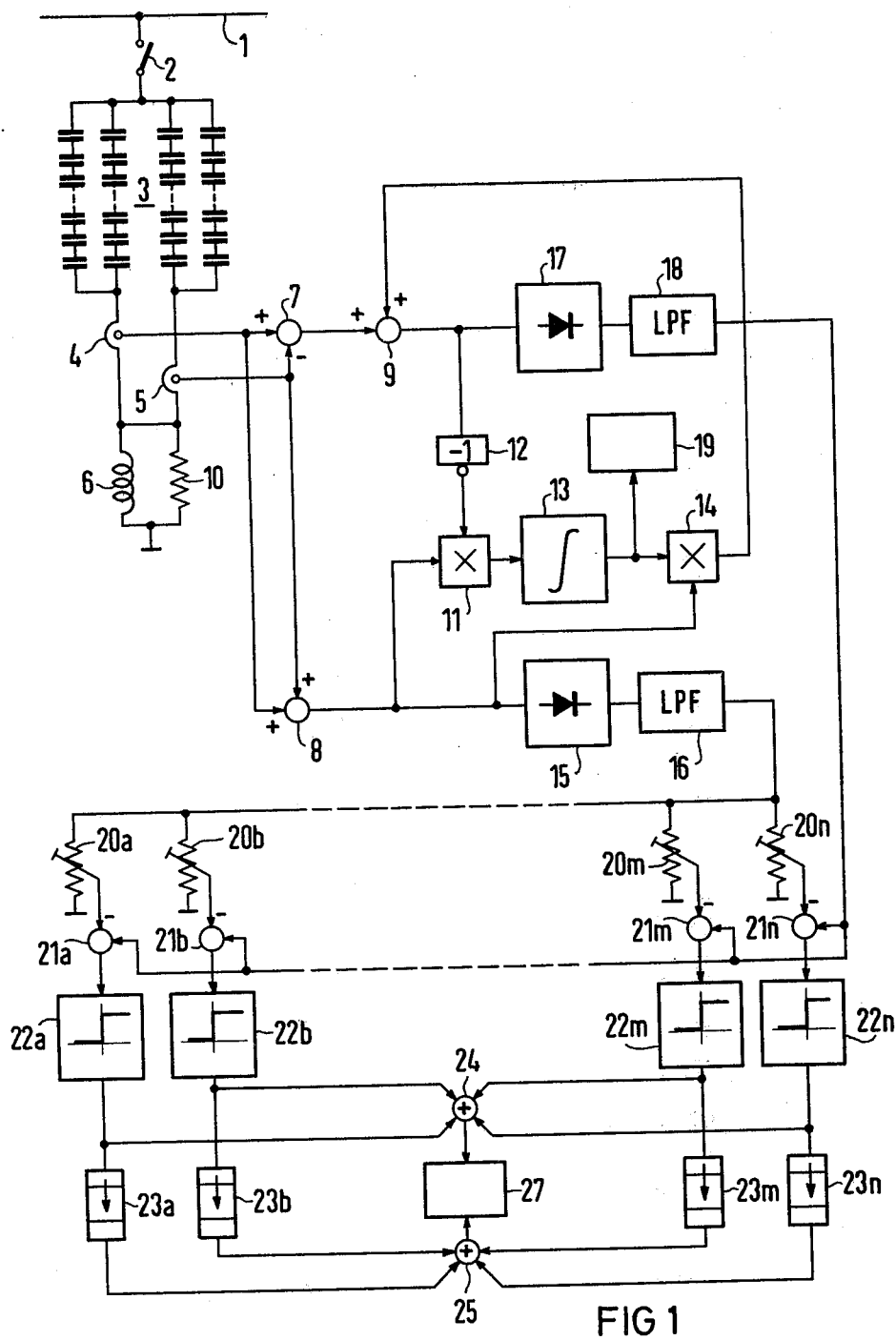
FIG. 1 depicts an illustrative embodiment of the invention partly in schematic form and partly in block and line representation.

FIG. 1 depicts an illustrative embodiment of the invention for monitoring capacitor battery 3 which, in this embodiment, is connected to a direct current transmission line 1. Capacitor battery 3 is part of a filter circuit which also contains inductor 6 and resistor 10 which are connected in parallel and to ground. A plurality of capacitors are arranged in four parallel branches, each of which may illustratively contain 20 capacitors connected in series, for forming capacitor bank 3. In this embodiment, the series capacitor branches are arranged in two symmetrically identical groups of two branches each, each of which has a respectively associated one induction current transformers 4 and 5 disposed around an associated lead conductor. Although the filter circuit would become detuned if one of the capacitors in capacitor battery 3 were to fail, such a failure would not render the filter circuit inoperable. It is desirable, however, that such a failure be indicated so that it may be corrected at a convenient time, illustratively during routine maintenance. Subsequent to the failure of one capacitor, the monitoring circuit should be prepared shortly thereafter to detect the failure of a second capacitor. Upon the failure of a second capacitor, the filter circuit would be sufficiently detuned that repair should be made as soon as possible. However, the failure of two capacitors should not require the filter circuit to be disconnected from the transmission line. As was the case subsequent to the failure of the first capacitor, the monitoring circuit should be quickly prepared to detect a third capacitor failure. Upon the occurrence of a third capacitor failure, the filter circuit should immediately be disconnected from the line by means of switch 2.

In this embodiment of the invention wherein the filter circuit is connected to a direct current transmission line, only harmonic frequency current components are detected by inductive current transformers 4 and 5. The output signals of such inductive current transformers correspond proportionally to the harmonic current flowing through the respectively associated halves of the capacitor battery. The output signals of the inductive current transformers are conducted to corresponding inputs of a comparator 7 which produces at its output a comparator signal which corresponds to the difference between the output signals of inductive current transformers 4 and 5, and consequently to the difference in the respective halves of capacitor battery 3. A signal corresponding to the total capacitor battery harmonic current is produced at the output of summing member 8 which sums the output signals of the inductive current transformers. In one practical embodiment of the invention, inductive current transformers of the potential-isolating type are used in which the signal corresponding to the difference and the sum of the current flowing through the capacitor battery legs are formed by appropriate wiring at the secondary of the transformers.

The embodiment of FIG. 1 contains drift compensation circuitry for compensating the effect of small differences in current flow between the branches of the capacitor battery, which may be caused by differences in temperature between the two halves. Moreover, the signal corresponding to the difference in current between the halves of the capacitor battery is compensated after a capacitor has failed, so that the failure of a further capacitor may be detected. The circuitry for achieving drift compensation consists of a mixer 9, and a non-linear control circuit consisting of integrating controller 13 and multipliers 11 and 14. The difference signal at the output of comparator 7 is conducted to an input of mixer 9 which is connected to its output to inverter 12. The output of inverter 12 and the output of summing member 8 are each conducted to respective inputs of multiplier 11 which provides an output signal to integrating controller 13. The output of integrating controller 13 and the output of summing member 8 are each connected to respective inputs of multiplier 14 which is connected at its output to an input of mixer 9. As a result of the polarity inversion caused by inverter 12, the output signal of multiplier 14 will be of the correct polarity for compensating a non-zero difference signal. The output signal of multiplier 14 represents the product of the total harmonic current and a factor which has been determined by integrating controller 13. The integration time constant of integrating controller 13 is relatively long, in the order of seconds. The output of multiplier 14 is added as a correction signal to the difference signal in mixer 9.

For purposes of explaining the operation of a nonlinear drift compensation circuit, it will be assumed that the harmonic sum current, as represented by the signal at the output of summing member 8, has a finite value, and that the difference signal at the output of comparator 7 is zero. Zero signal values at the outputs of comparator 7 and multiplier 14, which are both connected to respective inputs of mixer 9, result in a zero signal value at the output of mixer 9. If a difference between the currents flowing through the two halves of the capacitor battery is produced, non-zero signal value appears at the output of comparator 7, and therefore at the associated input of mixer 9. Since the output of multiplifer 14 is still zero, the non-zero difference signal is present at the output of mixer 9. The non-zero difference signal is conducted to inverter 12, which is connected at its output to an input of multiplier 11. Multiplier 11 multiplies the inverted difference signal with the signal corresponding to the total harmonic current and conducts a signal corresponding to the multiplied signals to integrating controller 13. Integrating controller 13 produces at its output a direct current signal which increases in amplitude in accordance with the integration time constant, which, as noted hereinabove, is in the order of seconds. Thus, multiplier 14 is provided at an input with a non-zero factor with which to multiply the signal at its other input which corresponds to the total harmonic current. The output signal of multiplier 14 is conducted to mixer 9. This signal, as indicated previously, is different polarity from the non-zero difference signal present at the other input of mixer 9. Integrating controller 13 continues to integrate as long as a non-zero value is present at its input. Thus, the non-zero signal at the output terminal of mixer 9 is slowly brought to zero. After the output signal of mixer 9 has been brought to zero, the output signals of the integrating controller 13 and of multiplier 14, retain their values until the difference signal at the output of comparator 7 changes once again.

It becomes apparent, therefore, that the output signal of integrating controller 13 is a measure of the degree of electrical asymmetry between the two halves of the capacitor battery 3. The output signal of integrating controller 13 is conducted to an evaluating circuit 19, which will be described in detail below in connection with FIG. 3.

The output signal of summing member 8 which represents the total harmonic current is conducted to a full-wave rectifier bridge 15, which is connected at its output to a low-pass filter 16. The output signal of low-pass filter 16 is a direct current signal which is proportional in amplitude to the total current flowing through capacitor bank 3. Similarly, the compensated difference signal at the output of mixer 9 is conducted to full-wave rectifier 17 which is connected at its output to low-pass filter 18. Prior to the operation of integrating controller 13, which, as noted hereinabove, contains a long integration time constant, the output signal of mixer 9 corresponds closely to the difference signal at the output of comparator 7. Thus, for a relatively long period of time after an imbalance has occurred in the capacitor bank, the output signal of mixer 9 corresponds to the difference signal. Thus, the output signal of low-pass filter 18 is an amplitude proportional direct current signal which represents the difference in current between the two halves of the capacitor battery, as long as the integrating controller 13 has not become operative. In this embodiment of the invention, the time constant of low-pass filter 16 corresponds closely to the time constant of low-pass filter 18.

The amplitude proportional direct current signals representing the difference current and the total current are compared in an evaluator system having n stages. Each evaluator stage contains an associated one of potentiometers 20a to 20n, comparators 21a to 21n, limit indicators 22a to 22n, and time delay stages 23a to 23n. The evaluator system further contains summing stages 24 and 25. Since the n evaluator stages are similarly constructed, only the first such evaluator stage will be described in detail.

Comparator 21a of the first evaluator stage receives at its non-inverting input the output signal of low-pass filter 18 which corresponds to the difference current, prior to the operation of integrating controller 13. The output signal of low-pass filter 16 which corresponds to the total capacitor battery current is reduced by a factor by operation of potentiometer 20a and is conducted to the inverting input of comparator 21a. The output signal of comparator 21a is conducted to a limit indicator 22a which is connected at its output to a time delay stage 23a. Time delay stage 23a has a predetermined delay response.

Potentiometers 20a to 20n are each advantageously adjusted differently from one another so as to produce at their outputs signals of different amplitudes. Depending upon the magnitude of the difference signal at the output of low-pass filter 18, one or several of limit indicators 22a through 22n will respond, if the difference signal, prior to the operation of integrating controller 13, exceeds any of the fractions of the total current signals at the inverting inputs of comparators 21. If the foregoing condition where the difference signal exceeds a given fraction of total current, persists for a period in excess of the response delay of the associate ones of time delay stages 23, such time delay stages will also respond. In this embodiment of the invention, the responsive output signals of all of the limit indicators 22 and all of the time delay stages 23 are standardized so as to be equal. The output signals of all of the limit indicators 22 are summed in a summing stage 24. Similarly, the output signals of all time delay stages 23 are summed in summing stage 25.

Figure 2:
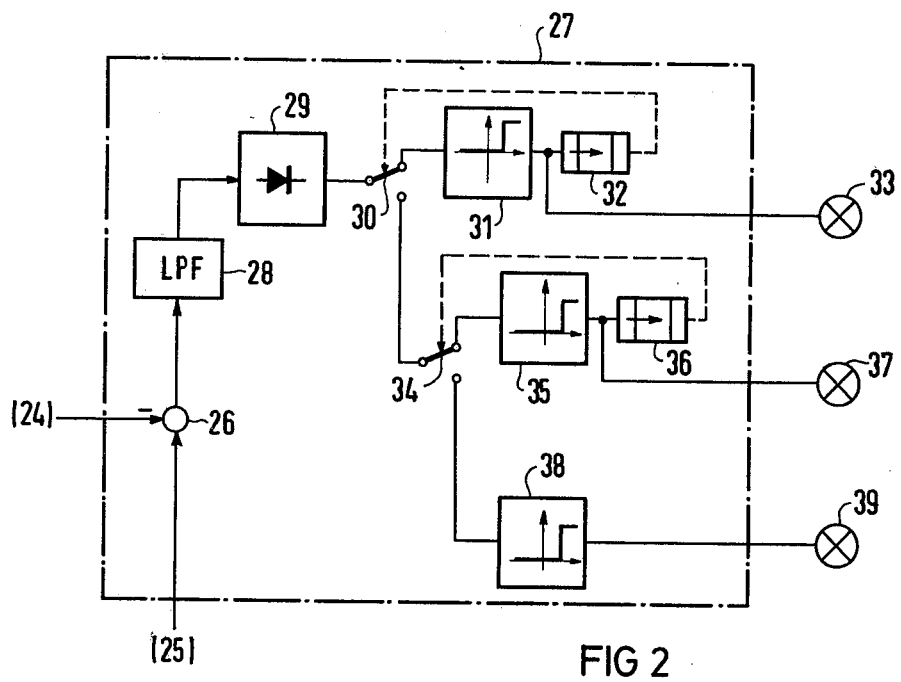
FIG. 2 illustrates in block and line form an evaluation circuit 27 which may be used in the embodiment of FIG. 1.

The output signals of summing stages 24 and 25 are conducted to an evaluation circuit which is shown in detail in FIG. 2. The output signals are compared in comparator 26 which is connected at its output to low-pass filter 28. Low-pass filter 28 has a smoothing time constant which is shorter than the response delay of time delay stages 23 in the evaluator system. The output signal of low-pass filter 28 is conducted to rectifier circuit 29 which is connected at its output to double-throw switch 30. As shown in FIG. 2, double-throw switch 30 connects the output of rectifier circuit 29 to a first indicator stage consisting of a limit indicator 31, a time delay stage 32 and an indicating device 33.

In operation, the response threshold of limit indicator 31 is preselected so that the limit indicator delivers an output signal only if the difference between the sum signals of the summers 24 and 25 exceeds a value corresponding to a predetermined number multiplied by the standardized value of the output signals of limit indicators 22 and time delay stages 23. For example, the response threshold of limit indicator 31 may be preset so as to produce an output signal when the difference between the output signals of summers 24 and 25 exceeds a value of three times the value of the standardized output signals of limit indicators 22, or time delay stages 23. If the mentioned difference remains smaller than three times the standardized output value, then it is assumed that the halves of the capacitor battery are tolerably asymmetrical, illustratively as a result of temperature effects. If, however, the mentioned difference exceeds the response threshold of limit indicator 31, then it is concluded that a capacitor has failed and a signal is conducted from the output of limit indicator 31 to indicating device 33 which preserves the indication. The output signal of limit indicator 31 also triggers time delay stage 32 which has a response delay which is longer than the response delay of time delay stages 23. Thus, after time delay stages 23 have responded so as to cause the difference between the outputs of summers 24 and 25 to disappear, time delay stage 32 will cause double-throw switch 30 to connect the output of rectifier 29 to the input of limit indicator 35. The response delay of time delay stage 32 is selected so as to correspond with the integration time constant of integrating controller 13.

Upon the expiration of the response delay of time delay stage 32, switch 30 is transferred and evaluation circuit 27 is ready to record a subsequent capacitor failure. Upon the occurrence of a second capacitor failure, the above-described operation recurs, except that this time the output signal of full-wave rectifier 29 is conducted to the input of limit indicator 35 by double-throw switches 30 and 34. If limit indicator 35 responds, an indication signal is stored in indicating device 37. Also, after the appropriate time delay circuits 23 respond to discontinue the difference between the outputs of summers 24 and 25, time delay stage 36 will respond by transferring double-throw switch 34 so as to connect the output of rectifier 29 to the input of limit indicator 38. Upon the occurrence of a third capacitor failure, limit indicator 38 will respond and an indication will be stored in indicating device 39, as described above.

It should be noted that the specific illustrative embodiment discussed herein contains three indicator stages for the purposes of illustration. Persons of skill in the art can provide more, or fewer, such stages without departing from the spirit and scope of the invention. In this embodiment of the invention, the response threshold of limit indicators 31, 35 and 38, are preferably preset to the same values. An indication at indicating device 33 signifies that one capacitor in the capacitor battery is defective. The filter circuit, however, can continue to operate. An indication at indicator 37 signifies that two capacitors are defective. Although the filter circuit must be repaired without delay, an emergency shut-down is not necessary.

Figure 3:
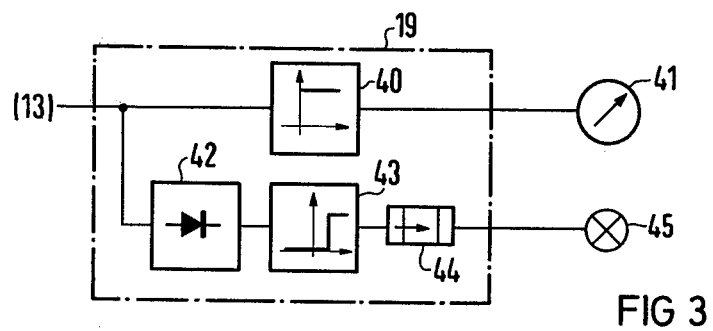
FIG. 3 shows an evaluation circuit 19 in block and line form which may be used in the embodiment of FIG. 1.

FIG. 3 shows a block and line representation of the design of evaluating circuit 19, in FIG. 1. Integrating controller 13 provides at its output a direct current output signal which is proportional in amplitude to the degree of electrical asymmetry between the two halves of the capacitor battery. As shown in FIG. 3, the output signal of integrating controller 13 is conducted to an input of a matching amplifier 40 which is connected at its output to a zero-center instrument 41. The direction of deflection of the pointer of the zero-center instrument can be advantageously selected to indicate toward the half of the capacitor battery which contains the defective capacitor. Such an indication can be achieved because the polarity of the output signal of the integrating controller is determined by whether the signal corresponding to the total capacitor current is in or out of phase with the signal corresponding to the difference in current flow between the two halves of the capacitor battery.

The direct current output signal of the integrating controller 13 is conducted to a full-wave rectifier circuit 42 which is connected at its output to a limit indicator 43. The output signal of rectifier circuit 42 is a direct current signal which corresponds in amplitude to the degree of asymmetry between the two halves of the capacitor battery. Such a direct current signal, however, corresponds to the magnitude of the asymmetry, without regard to whether such asymmetry is positive or negative. The response threshold of limit indicator 43 is preset to a level which corresponds to an unacceptable degree of asymmetry. The output of limit indicator 43 is connected to a time delay circuit 44 having a predetermined delay response interval which is triggered when the threshold response of limit indicator 43 is exceeded. If an unacceptable degree of asymmetry, illustratively caused by the failure of three capacitors in one half of the capacitor battery, persists for a time period in excess of the response delay of delay circuit 44, the delay circuit will conduct a fault indication signal to indicating device 45, and such an indication is preserved.

In one undisturbed condition of a specific illustrative embodiment of the invention, minor asymmetries occur between the two capacitor battery halves which are compensated by integrating controller 13, prior to the activation of the evaluation stages connected thereto. In the event of a larger magnitude of asymmetry, illustratively resulting from the effects of temperature, it is possible that one or more limit indicators 22 respond. This would produce a difference signal at the output of comparator 26, which difference signal would not be of sufficient magnitude to exceed the response threshold of limit indicator 31. Upon the expiration of the delay response of the associate one of time delay stages 23, the difference signal would be returned to a zero value. Integrating controller 13 would operate to return the signal at the outputs of mixer 9, which represents the compensated difference signal, to zero.

If one capacitor in the capacitor battery fails, at least three of the limit indicators 22 should respond. Limit indicator 31 should also respond and actuate indicating device 33. Upon the expiration of a response delay, time delay stages 23 would operate to prepare the evaluation circuit for detecting subsequent capacitor failures. As previously indicated, second and third capacitor failures would cause activation of indicating device 37 and 39, respectively. However, if more than three capacitors fail in one-half of the capacitor battery, limit indicator 43 in evaluating circuit 19 would also respond.

Figure 4:
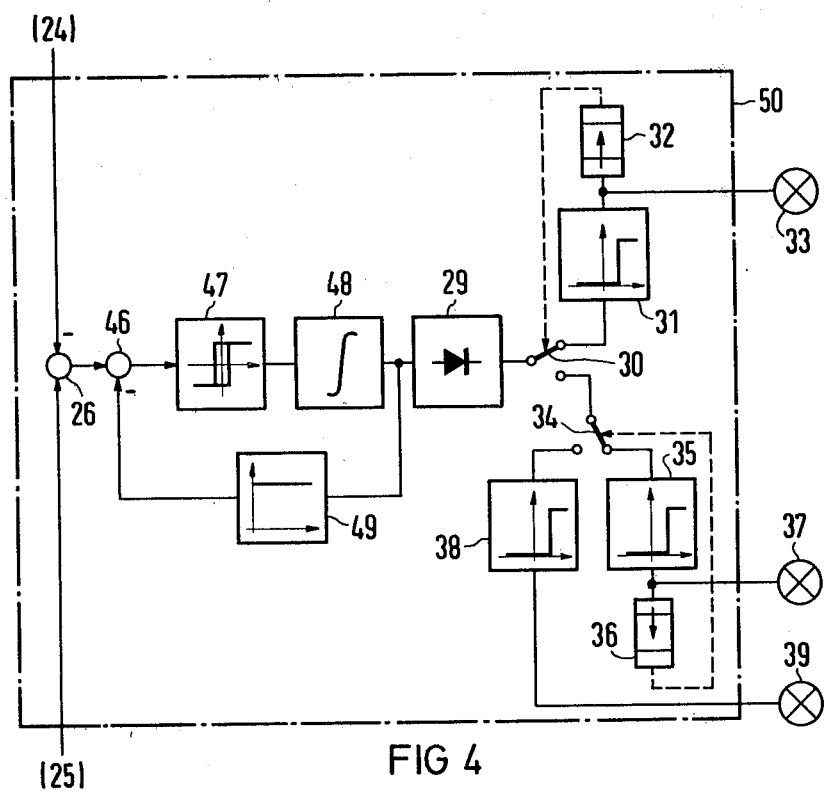
FIG. 4 shows a block and line representation of an evaluation circuit 50 which may be used in place of evaluation circuit 27 in FIG. 1 and FIG. 2.

FIG. 4 shows a further exemplary embodiment of an evaluation circuit 50 which can be used instead of evaluation circuit 27 in FIGS. 1 and 2. In the circuit of FIG. 4, the sum signals from summers 24 and 25 are conducted to comparator 26, which feeds via a further comparator 46 to a polarity trigger 47. Polarity trigger 47 changes its output signal in response to the polarity of the input signal. Trigger 47 is connected at its output to the input of integrator 48, the output of which is fed back to comparator 46 by means of a linear amplifier 49. In addition, the output signal of integrator 48 is conducted to the input of rectifier circuit 29. Rectifier circuit 29 is connected at its output to a double-throw switch 30, which, as shown in the Figure, is connected to indicating circuitry which operates in the manner described hereinabove in connection with FIG. 2.

It is occasionally desirable to avoid the issuance of a fault indication even though the signal corresponding to the difference in the currents between the legs of the capacitor battery may be temporarily very high. Such conditions may result in the event of short circuits at the transmission line which result in the temporary saturation of current transformers 4 and 5. Evaluating circuit 50 alleviates this problem by controlling the delivery of the difference signal at the output of comparator 26 to limit indicator 31. Such control, which includes correspondence to the integration time constant of integrator 48, permits the signal corresponding to the difference in the currents flowing through the capacitor battery legs to be temporarily very high for a period of time corresponding to the integration time constant of integrator 48, without issuing a fault indication.

Figure 5:
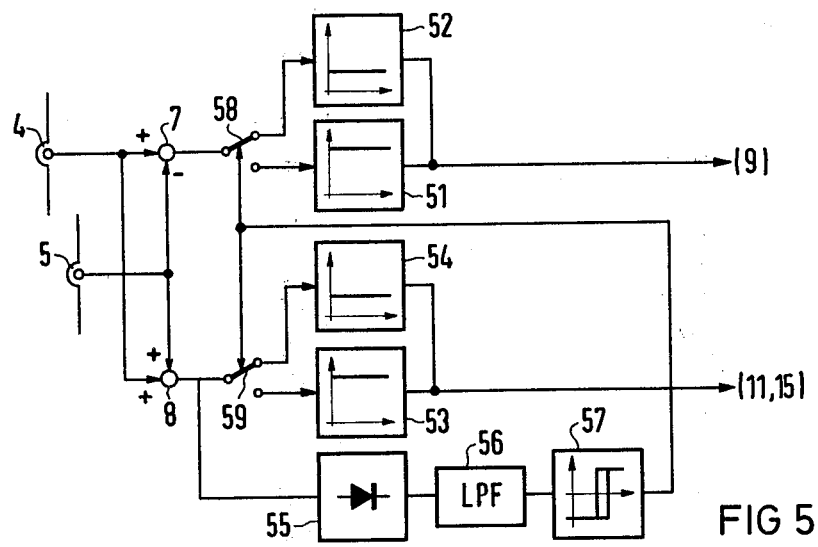
FIG. 5 shows a block and line representation of a range switching arrangement.

FIG. 5 shows an input circuit which contains an automatic range switching feature which can be incorporated into the embodiment of FIG. 1, in situations where the total current flowing through the capacitor battery varies over a wide range. As shown in the Figure, the output terminal of comparator 7 is connected by switching element 58 to the input of amplifier 52. Similarly, the output terminal of summing member 8 is conducted to the input of amplifier 54 by means of switching element 59. The output of summing member 8 is also connected to the series combination of a rectifier 55, a low-pass filter 56, and a limit indicator 57. The output signal of limit indicator 57 controls the state of switching elements 58 and 59. If the output signal of summing member 8, which corresponds to the total current flowing through the capacitor bank, exceeds, or falls below, a predetermined threshold limit, double-throw switching elements 58 and 59 are switched over in such a manner that, when the output signal of summing member 8 is below the predetermined threshold limit, switching elements 58 and 59 are switched over so as to connect the respective outputs of comparator 7 and summing member 8 to high gain amplifiers 51 and 53, respectively. However, if the output signal of summing member 8 exceeds the predetermined threshold limit, switching elements 58 and 59 will switch over to the state shown in the Figure so as to connect the output of comparator 7 and the output of summing member 8 to lower gain amplifiers 52 and 54, respectively. Thus, linear amplifiers 52 and 54 are operative when capacitor bank 3 conducts a large current, and linear amplifiers 51 and 53 are operative when the capacitor bank conducts a low current.

In another embodiment of the invention (now shown), the gain in the respective difference signal and total signal channels can be advantageously adjusted by the use of a switching system in the feedback network of respective linear amplifiers. One manner of implementing the alternative system would be to advantageously connect and disconnect ohmic resistances in the feedback loop of the linear amplifiers, in response to the total capacitor bank current.

Although the inventive concept herein has been disclosed in terms of specific embodiments and applications, other applications and embodiments will be obvious to persons skilled in the pertinent art without departing from the scope of the invention. The drawings and descriptions of specific embodiments of the invention in this disclosure are illustrative of applications of the invention and should not be construed to limit the scope thereof.

What is claimed is:

1. A circuit for monitoring the capacitor battery of a filter circuit connected to a transmission line, the capacitor battery being composed of a multiplicity of individual capacitors which are arranged in at least two similar parallel legs, each leg having a plurality of capacitors connected in series, characterized in that there are provided:
   a. means for producing a first signal which is responsive to the total alternating current flowing through the capacitor battery,
   b. means for producing a second signal which is responsive to the difference between the alternating currents flowing through the parallel legs of the capacitor battery,
   c. means for producing at least one third signal which is responsive to the difference between a predetermined fraction of said first signal, and said second signal, and
   d. means responsive to said third signal for producing a fault indication signal if the amplitude of said third signal exceeds a predetermined threshold value.

2. The circuit of claim 1 in which there is further provided drift correction circuitry for compensating for unequal currents flowing through the parallel legs of the capacitor battery, the drift correction circuitry comprising:
   a. mixer means having a first input terminal for receiving said second signal, a second input terminal for receiving a correction signal, and an output terminal for providing a signal corresponding to the sum of the signals at said first and second input terminals,
   b. inverter means having an input terminal connected to the output terminal of said mixer means and an output terminal for providing a signal corresponding to the polarity-inverted output signal of said mixer means,
   c. first multiplier means having a first input terminal for receiving said first signal, a second input terminal connected to the output terminal of said inverter means, for receiving said inverted signals from the output terminal of said mixer means, and an output terminal for producing a signal corresponding to the product of the signals at said first and second input terminals,
   d. integrating means having an input terminal for receiving the signal at the output terminal of said first multiplier means, and an output terminal for providing a signal corresponding to an integration of the signal at said input terminal, over a predetermined integration time constant, which output signal corresponds to the degree of inequality between the currents flowing through the parallel legs of the capacitor battery, and
   e. second multiplier means having a first input terminal for receiving said first signal, a second input terminal connected to the output terminal of said integrating means, and an output terminal connected to said second input terminal of said mixer means for providing a correction signal.

3. The circuit of claim 1 in which there is further provided:
   a. first amplifier means having adjustable gain, for amplifying said first signal,
   b. second amplifier means having adjustable gain, for amplifying said second signal, and
   c. means for adjusting the gains of said first and second amplifier means in response to the amplitude of said first signal.

4. The circuit of claim 1 in which there is further provided n−1 means for producing n−1 additional third signals, each of the n third signals being responsive to a respective predetermined fraction of said first signal, the circuit further comprising:
   a. n limiter means, each having a predetermined response threshold, an input terminal for receiving a respectively associated one of said n third signals, and an output terminal for providing a standardized output signal when the respectively associated ones of said n third signals exceeds the predetermined response threshold,
   b. first summer means having n input terminals, each connected to a respectively associated output terminal of said n limiter means, and an output terminal for providing a signal responsive to the sum of the output signals of said n limiter means,
   c. n time circuits, each having a predetermined response delay interval, an input terminal connected to a respectively associated one of said n limiter means, and an output terminal for providing a standardized output signal in response to the standardized output signal of the respectively associated one of said n limiter means and the response delay interval,
   d. second summer means having n input terminals each connected to a respectively associated one of the output terminals of said n time delay circuits, and an output terminal for providing a signal responsive to the sum of the output signals of said n time delay circuits, and
   e. evaluation means for providing a fault indication signal if the difference between the output signals of said first and second summer means exceeds a predetermined level.

* * * * *